United States Patent
Joseph

(10) Patent No.: US 6,958,862 B1
(45) Date of Patent: Oct. 25, 2005

(54) USE OF A LENSLET ARRAY WITH A VERTICALLY STACKED PIXEL ARRAY

(75) Inventor: Domenick Montalbo Joseph, Menlo Park, CA (US)

(73) Assignee: Foveon, Inc., Santa Clara, CA (US)

( * ) Notice: Subject to any disclaimer, the term of this patent is extended or adjusted under 35 U.S.C. 154(b) by 0 days.

(21) Appl. No.: 10/421,382

(22) Filed: Apr. 21, 2003

(51) Int. Cl.[7] .................. G02B 27/10; H01L 31/113; H01L 21/00; G02F 1/1335
(52) U.S. Cl. ................. 359/621; 257/294; 349/95; 438/70
(58) Field of Search ................. 257/232, 233, 257/291, 292, 294, 432; 359/619–622; 349/95, 106; 438/70

(56) References Cited

U.S. PATENT DOCUMENTS

| | | | |
|---|---|---|---|
| 4,878,121 A | * | 10/1989 | Hynecek .................... 348/319 |
| 5,965,875 A | | 10/1999 | Merrill ...................... 250/226 |
| 6,252,218 B1 | * | 6/2001 | Chou ....................... 250/208.1 |
| 6,801,719 B1 | * | 10/2004 | Szajewski et al. .......... 396/333 |

OTHER PUBLICATIONS

"A Primer on Photodiode Technology," Photodiode Technology, at http:/www.centrovision.com/tech2.htm, Feb. 24, 2003, pp. 1–13.

* cited by examiner

*Primary Examiner*—Georgia Epps
*Assistant Examiner*—William Choi
(74) *Attorney, Agent, or Firm*—Sierra Patent Group, Ltd.

(57) ABSTRACT

An improved optical imaging system includes a vertically stacked pixel array and a lenslet array for capturing images while minimizing the focal length. The vertically stacked pixel array is configured to operate as an image sensor. The lenslet array is configure to focus the image on the image sensor. Each lens of the lenslet array focuses an image on a sub-array of the image sensor. Each sub-array is shifted from one another so that additional data obtained for each equivalent pixel in each sub-array. An image is obtained by combining the data of each sub-array.

15 Claims, 6 Drawing Sheets

USE OF A LENSLET ARRAY WITH A VERTICALLY STACKED PIXEL ARRAY

FIELD OF THE INVENTION

The present invention relates generally to pixel array technology. More particularly, the present invention relates to an optical imaging system with a vertical pixel array in combination with a lenslet array.

BACKGROUND OF THE INVENTION

Imaging sensors are commonly used in various applications such as digital cameras. The imaging sensor includes multiple pixel sensors that are arranged in an array. Light is reflected from a scheme and received by the imaging sensor. The imaging sensor provides signal outputs that have magnitudes that correspond to the light intensity level for each pixel sensor within the array.

Conventional color imaging sensors use a color filter mosaic to select different wavelength bands at different photodiode locations. The photodiodes for these color filter mosaics are arranged to detect as wide a range of the color spectrum as possible while using color filters to limit the detection to a single desired color. One example of a color filter mosaic is the Bayer color filter array as shown in FIG. 1. The Bayer color filter array (100) has green pixels (G) arranged in a checkerboard and alternating lines of red (R) and blue (B) pixels to fill in the remainder of the pattern. The Bayer color filter array takes advantage of the human eye's sensitivity to high spatial frequencies in luminance, which is primarily composed of green light. The Bayer color filter array therefore improves the perceived sharpness of the digital image. A single lens system as shown in FIG. 2 is often used in conjunction with a Bayer color filter array. The single lens system (200) includes a lens (202) positioned over the image sensor (204) to focus the image onto the image sensor (204). An example of a single lens system is a standard camera with an attachable lens. In a single lens system the focal length is often dependant on the lens used and the tolerances for obtaining an accurate image may increase manufacturing costs.

SUMMARY OF THE INVENTION

An improved optical imaging system includes a vertically stacked pixel array and a lenslet array for capturing images while minimizing the focal length. The vertically stacked pixel array is configured to operate as an image sensor. The lenslet array is configured to focus the image on the image sensor. Each lens of the lenslet array focuses an image on a sub-array of the image sensor. Each sub-array is shifted from one another so that additional data obtained for each equivalent pixel in each sub-array. An image is obtained by combining the data of each sub-array.

According to one aspect of the present invention, a method is provided for capturing an image that comprises positioning a lenslet array parallel to a vertically stacked pixel array. The lenslet array is spaced from the vertically stacked pixel array according to an associated focal length. The lenslet array focuses light reflected from an image source onto the vertically stacked pixel array, wherein each pixel of the vertically stacked pixel array senses multiple colors of light. Data that is associated with each pixel is read such that an image is obtained.

According to another aspect of the present invention, in order to obtain the image, the vertically stacked pixel array is separated into sub-arrays, wherein each sub-array corresponds to a lens of the lenslet array. Each sub-array is shifted away from the other sub-arrays such that data associated with each sub-array is different from data associated with the other sub-arrays. Data associated with each sub-array is combined to produce an image that is larger than each individual sub-array. Stated differently, the vertically stacked pixel array is separated into sub-arrays that are each shifted away from each other sub-array. Accordingly, an image read by each sub-array includes a center that is different from a center of each other sub-array. A pixel associated with a first sub-array may be interpreted as a logically adjacent pixel to an equivalent pixel in second sub-array. The image read by a first sub-array that is the same image read by a second sub-array with the center difference, such that data corresponding to the first sub-array and data corresponding to the second sub-array are combined to produce an image that corresponds to the number of pixels in the vertically stacked pixel array.

According to a further aspect of the present invention, an optical imaging system is provided that comprises a vertically stacked pixel array that is arranged as an image sensor. Each pixel of the vertically stacked pixel array senses multiple colors of light. A lenslet array is positioned parallel to the vertically stacked pixel array between the vertically stacked pixel array and an image source. The distance between the vertically stacked pixel array and the lenslet array corresponds to a focal length associated with the lenslet array. The optical imaging system produces an image according to the images focused on the vertically stacked pixel array by the lenses of the lenslet array.

According to still another aspect of the invention, an optical imaging system is provided for capturing an image. The system comprises multiple means for sensing light that are arranged in an array. Each means for sensing light is arranged to sense multiple colors of light. Multiple means for focusing light are arranged in an array. The means for focusing light are spaced from the means for sensing light according to an associated focal length. Means for interpreting data is associated with each means for sensing light such that an image is obtained, whereby the focal length and color distortion are minimized.

A more complete appreciation of the present invention and its improvements can be obtained by reference to the accompanying drawings, which are briefly summarized below, the following detail description of presently preferred embodiments of the invention, and the appended claims.

DETAILED DESCRIPTION OF THE PREFERRED EMBODIMENT

Figure 2:
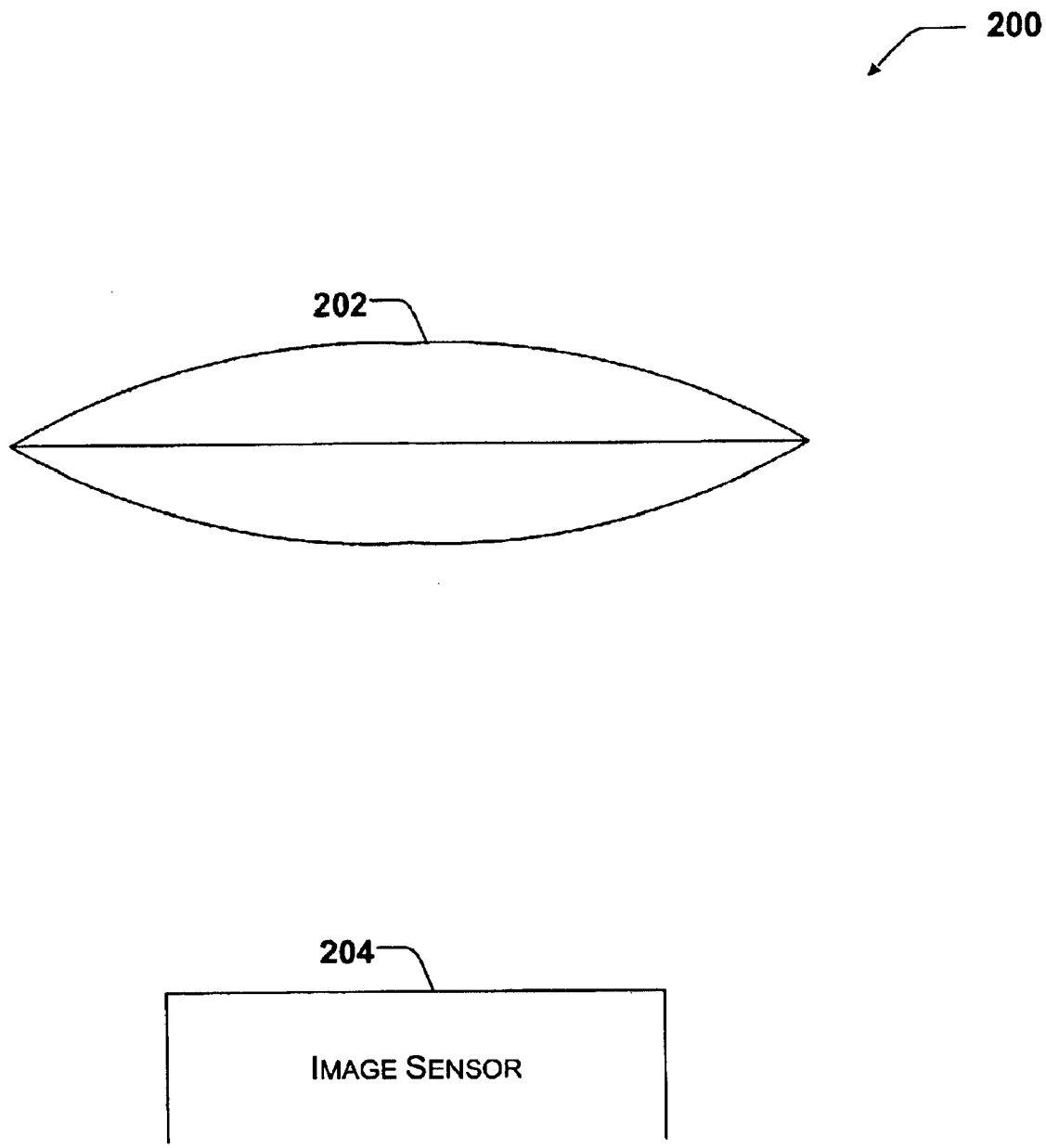
FIG. 2 illustrates the use of a single lens for focusing an image on an image sensor.

The present invention overcomes the disadvantages of previous optical imaging systems by using a lenslet array with a stacked pixel array to reduce costs, shorten the focal length, and avoid color distortion. As previously described, a Bayer color filter array may be used to increase the perceived sharpness of a digital image. As with other optical imaging systems, a system using a Bayer color filter array requires a lens to focus the image on an image sensor (see FIG. 2). However, it is possible to us a lenslet or micro-lens array to provide the same function. The lenslet array provides a shorter focal length at potentially decreased costs. The shorter focal length may prove to be an important factor for compact digital cameras by decreasing an essential dimension to their design. However, the image projected by a lenslet array onto a Bayer color filter array is subject to severe color distortion due to a "moiré" pattern between the lenslet array image and the Bayer color filter array. A moiré pattern generally refers to an independent usually shimmering pattern seen when two geometrically regular patterns (as two sets of parallel lines or two halftone screens) are superimposed. Superimposing the lenslet array on the Bayer filter array can therefore result in a distortion that adversely affect the sensed image. These moiré patters may be avoided by using a lenslet array with a vertically stacked pixel array in accordance with the present invention.

Figure 3:
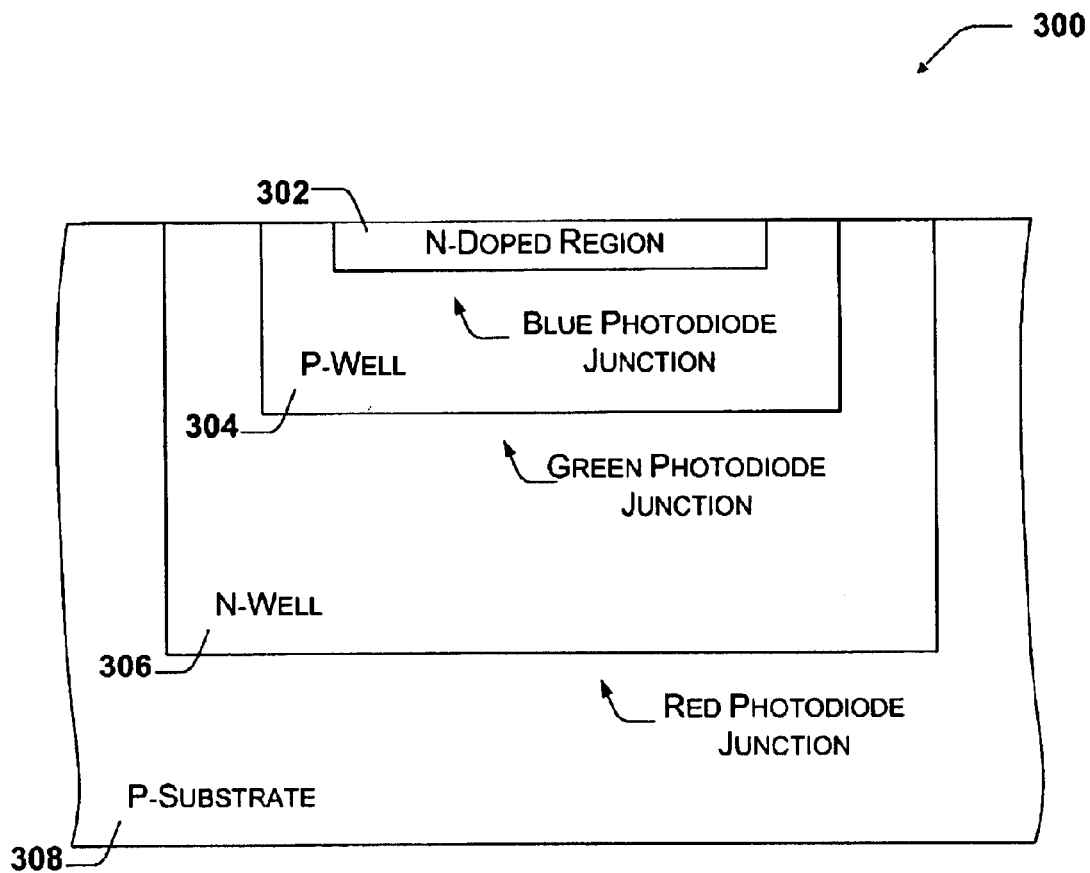
FIG. 3 is a partial cross-sectional view of a triple-well or vertically stacked photodiode cell.

FIG. 3 illustrates a partial cross-sectional view of a vertically stacked photodiode cell for use with the present invention. The vertically stacked photodiode cell (300) takes advantage of the differences in absorption length in silicon of light. Light of different wavelengths is absorbed in silicon at different lengths. The vertically stacked photodiode cell places blue, green, and red collection layers at different depths within the cell to measure different colors in the same pixel location.

Described differently, when light is absorbed in the active area of silicon, an electron-hole pair is formed. The electrons and holes are separated, with electrons passing to the "n" region and holes to the "p" region. The movement of electrons and holes to their respective regions generates a current in response to the light, allowing the light to be measured. The depth at which the electron-hole pair is formed is proportional to energy of the light that is proportional to the color of the light. Blue light, having the shortest wavelength, is absorbed near the top of a silicon cell. Green light, having a longer wavelength, is absorbed deeper in a silicon cell than blue light. Red light has a longer wavelength than both blue and green light and is absorbed deeper in a silicon cell than both blue and green light. A measurement for each color is received by measuring the current generated at different collection layers within the vertically stacked photodiode cell (300). The vertically stacked photodiode cell is arranged with pn junctions at selected depths within the silicon to form photodiodes. The pn junction between the n-doped region (302) and the p-well (304) forms a blue-sensitive photodiode, the pn junction between the p-well (304) and the n-well (306) forms a green sensitive photodiode, and the pn junction between the n-well (306) and the p-substrate (308) forms a red sensitive photodiode. This vertically stacked photodiode cell architecture allows the colors of light (blue, green, red) to be measured at a single pixel location. Vertically stacked photodiode cell architectures other than the exemplary architecture shown may also be used with the present invention without departing from the scope of the invention.

Figure 1:
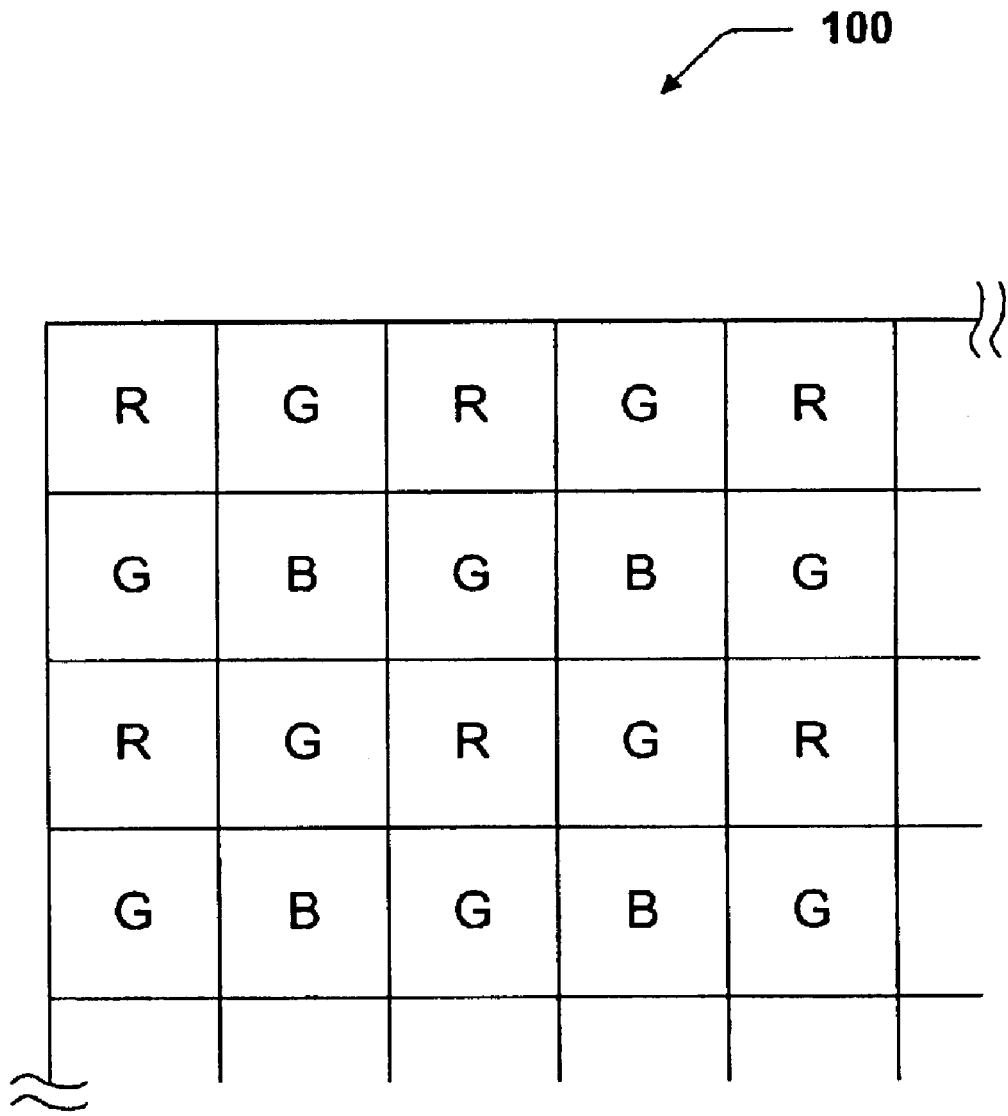
FIG. 1 illustrates the Bayer color filter array pattern.
Figure 4:
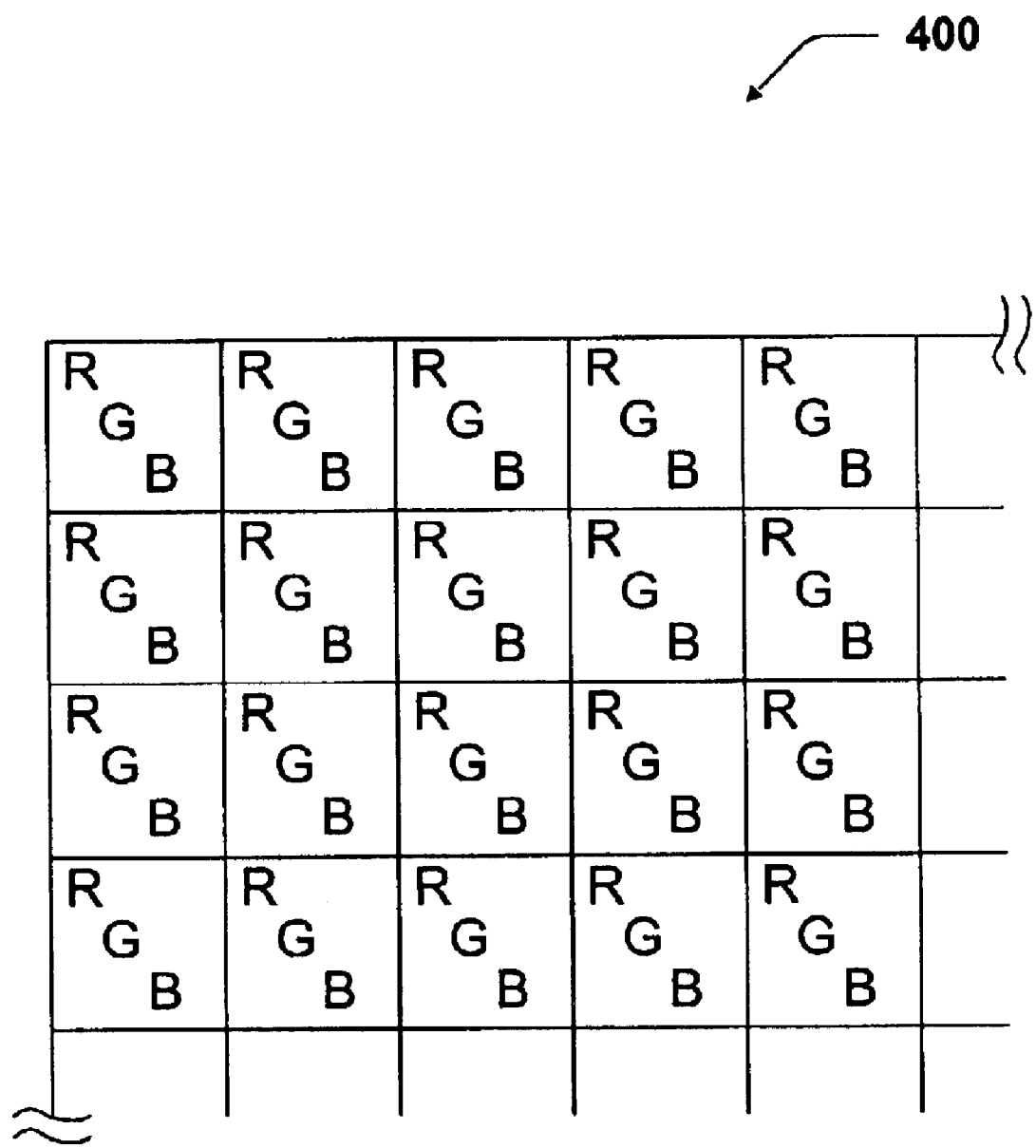
FIG. 4 is an exemplary color array pattern that corresponds to a vertically stacked pixel array.

FIG. 4 is an exemplary color array pattern that corresponds to a vertically stacked pixel array. The color array pattern illustrates that each pixel location senses all three colors (blue, green, red) corresponding to the use of vertically stacked photodiodes. The illustration of the color pattern for a vertically stacked pixel array is provided in contrast to the Bayer filter array pattern shown in FIG. 1. The requirement of color filters is removed since the colors of light (blue, green, red) are measurable at each pixel location.

Figure 5:
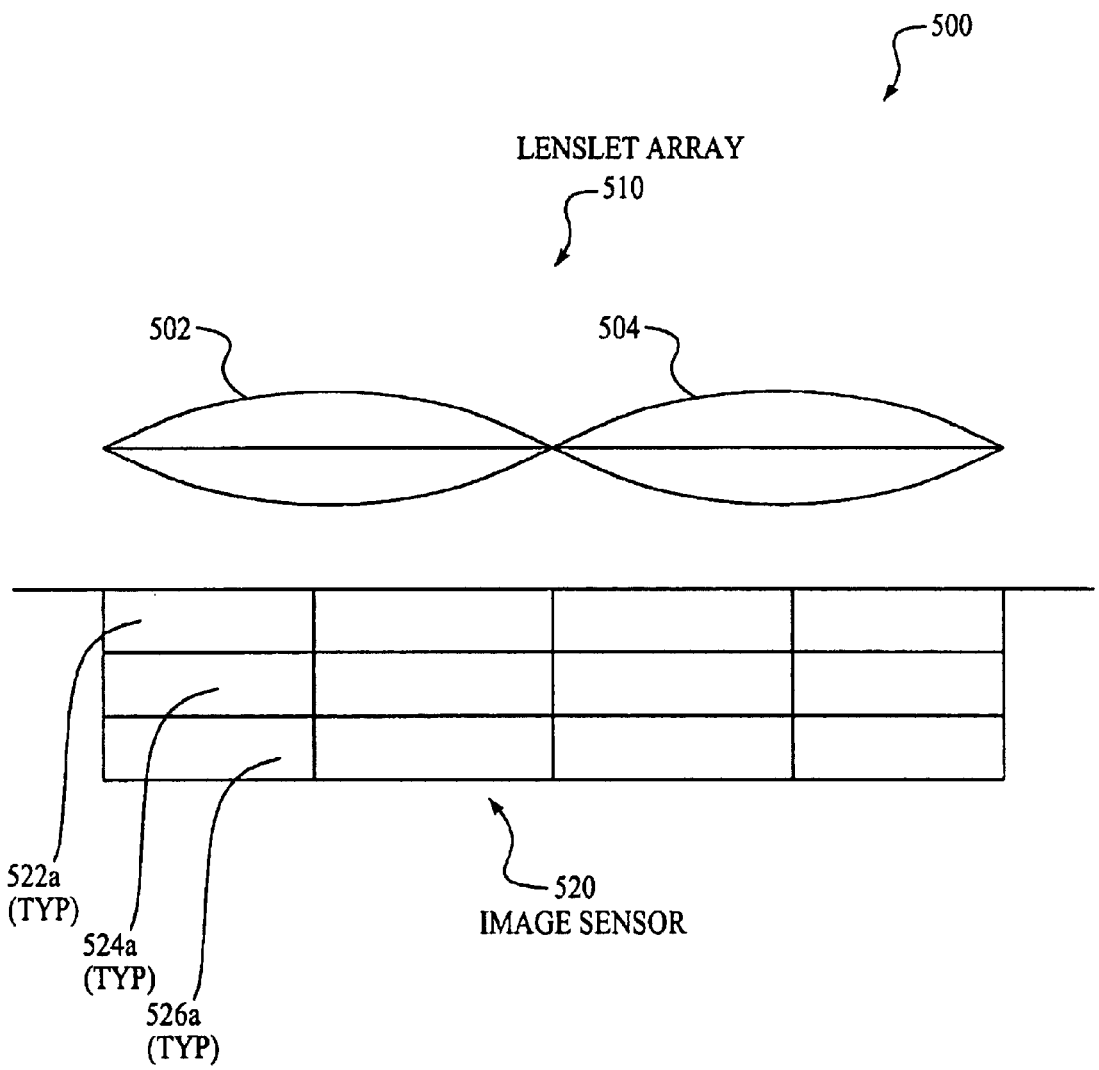
FIG. 5 is a partial cross-sectional view of a lenslet array used in combination with a vertically stacked pixel array.

FIG. 5 is a partial cross-sectional view of a lenslet array used in combination with a vertically stacked pixel array, in accordance with the present invention. The lenses (502 and 504) of the lenslet array (510) are positioned parallel, above the image sensor (520), between the image sensor and the image source. Each of the photodiodes (e.g., 522a) is vertically stacked in each pixel location to sense all three colors (blue, green, red). The photodiodes sensing blue light (e.g., 522a) are positioned near at the top of the stack. The photodiodes sensing green light (e.g., 524a) are positioned in the middle of the stack. The photodiodes sensing red light (e.g., 526a) are positioned at the bottom of the stack. In another embodiment, a vertically stacked photodiode cell is used to provide the vertically stacked photodiodes similar to the embodiment shown in FIG. 3. The lenslet array (510) uses smaller lenses, yet gives the same effect as a large lens in focusing an image on the image sensor (520). The lenslet array (510) however allows for a shorter focal length between the lenses and the image sensor (520) than does a large single lens. The shorter focal length allows for smaller packaging of the optical imaging system. For example, a digital camera manufactured with a lenslet array (510) may potentially reach smaller overall packaging designs than available for digital cameras using single lenses to focus the image on the image sensor (520).

Figure 6:
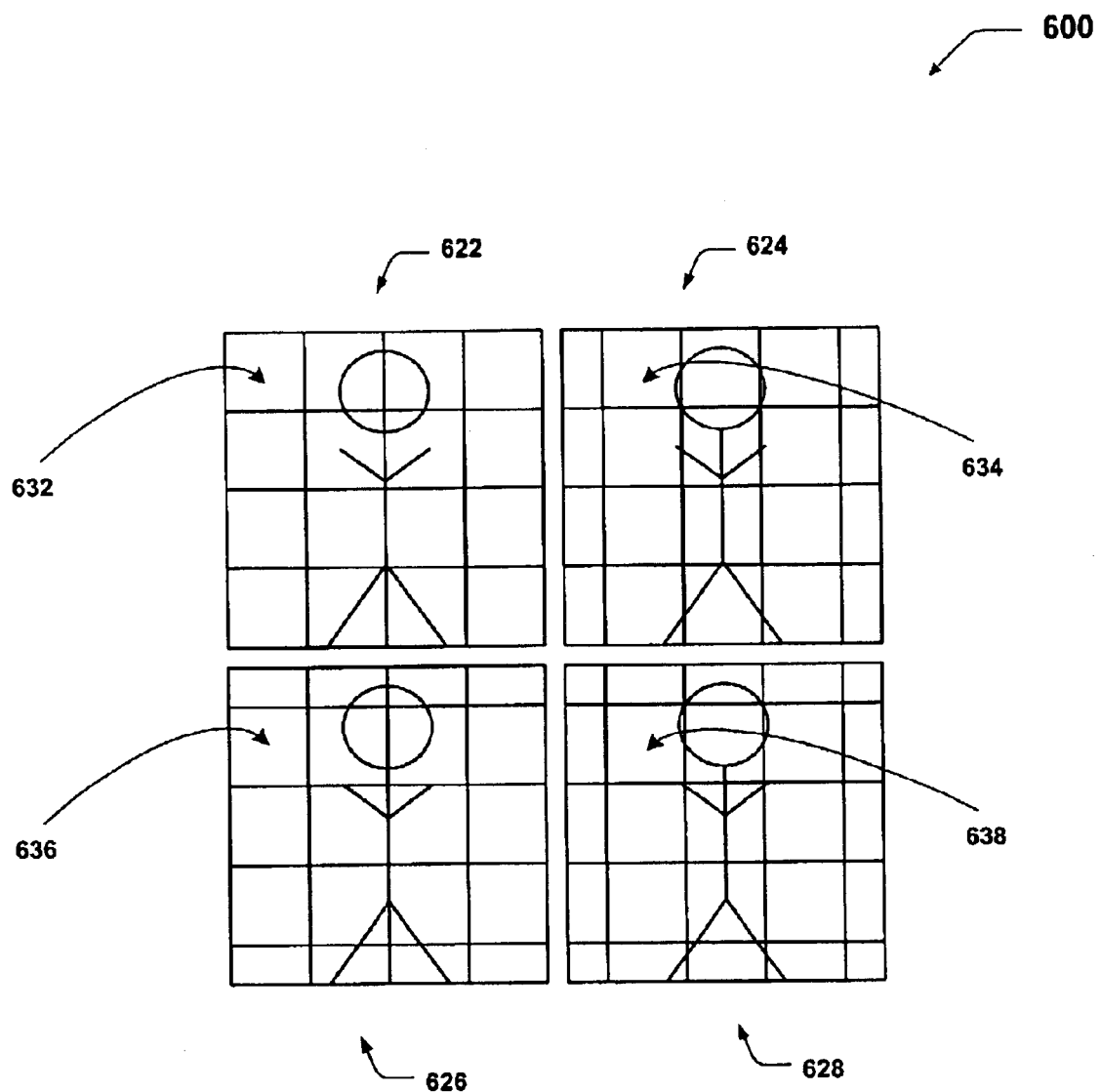
FIG. 6 is a top-down view of an exemplary vertically stacked pixel array that is used with a lenslet array, in accordance with the present invention.

FIG. 6 is a top-down view of an exemplary vertically stacked pixel array that is used with a lenslet array, in accordance with the present invention. The lenslet-array (not shown) exposes the whole image on multiple sub-arrays (e.g., 622) within the total array of the vertically stacked pixel array (600). In the example shown, the vertically stacked pixel array (600) includes an 64 array of pixels. Four lenses of a lenslet array (not shown) are positioned over the vertically stacked pixel array (600) to focus the image. Each of the four lenses covers a 16 pixel sub-array (622, 624, 626, 628), or one-quarter of the vertically stacked pixel array (600). Each of the sub-arrays (622, 624, 626, 628) is shifted with relation to the others to give the photodiodes of each of the 16 pixel sub-arrays a slightly different center. The shifted center difference between each 16 pixel sub-array (622, 624, 626, 628), produces additional data to obtain a 64 pixel resolution image by combining the data of each 16 pixel sub-array.

For example, an object within an image (shown here as stick figure) may be focused by a lenslet array (not shown) such that it is centered in each of the four sub-arrays (622, 624, 626, 628). When the images are read, the data corresponding to each of the four sub-array images is interpreted. With each sub-array shifted, a slightly different center is achieved for each of the sub-arrays. In one embodiment, sub-array 624 is shifted one-half pixel to the right with respect to sub-array 622. Similarly, sub-array 626 is shifted one-half pixel down with respect to sub-array 622. Sub-array 628 is shifted one-half pixel to the right and down with respect to sub-array 622. With sub-arrays 624, 626, and 628 effectively shifted away from sub-array 622, the data corresponding to the pixels in each of the sub-arrays is different from the data obtained in each of the other sub-arrays.

The shifted sub-arrays allow a pixel (e.g., 634) in a shifted sub-array (e.g., 624) to be interpreted as logically adjacent to the equivalent pixel (e.g., 632) in the un-shifted sub-array. For example, pixel 634 is interpreted as the pixel logically adjacent and to the right of pixel 632, and pixel 636 is interpreted as the pixel logically adjacent and below pixel 632. Accordingly, for each equivalent pixel in each of the sub-arrays, more than a single pixel of data is obtained. In the example shown, four times the data of one sub-array is obtained by using a four lens lenslet array. Combining the data of the four shifted images, a 64 pixel resolution image is obtained using a lenslet array in combination with a vertically stacked pixel array. As previously stated, the use of a lenslet array with the vertically stacked pixel array allows for an optical imaging system that minimizes the focal length. The shorter focal length may result in an optical imaging system that is smaller, cheaper, color minimizing color distortion, and has improved tolerance levels for manufacturing.

Any number of vertically stacked pixels may be combined with any multiple of lenses in a lenslet array to achieve the invention as described. Lenses or lenslet arrays in a variety of shapes and sizes may also be used with departing from the scope of the invention. The data associated with each pixel may be interpreted by a circuit, computer, or other data processing means without departing from the scope of the invention.

The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A method for capturing an image, comprising:
   positioning a lenslet array parallel to a vertically stacked pixel array, wherein the lenslet array is spaced from the vertically stacked pixel array according to an associated focal length;
   focusing light reflected from an image source onto the vertically stacked pixel array, wherein each pixel of the vertically stacked pixel array senses multiple colors of light;
   reading data that is associated with each pixel such that an image is obtained, whereby the focal length and color distortion are minimized; and
   each pixel of a vertically stacked pixel array corresponds to a vertically stacked photodiode cell, wherein each vertically stacked photodiode cell includes photodiodes formed at different depths in silicon, such that each photodiode is sensitive to a different color of light; and
   wherein the vertically stacked pixel array is separated into sub-arrays, wherein each sub-array corresponds to a lens of the lenslet array.

2. The method as in claim 1, wherein focusing light reflected from the image source onto the vertically stacked pixel array further comprises focusing a separate image onto a portion of the vertically stacked pixel array corrsponding to each lens within the lenslet array.

3. The method as in claim 1, wherein each sub-array is shifted away from the other sub-arrays such that data associated with each sub-array is different than data associated with the other sub-arrays.

4. The method as in claim 1, wherein data associated with each sub-array is combined to produce an image that is larger than each individual sub-array.

5. The method as in claim 1, further comprising separating the vertically stacked pixel array into sub-arrays that are each shifted away from each other sub-array, such that an image read by each sub-array includes a center that is different than a center of each other sub-array.

6. The method as in claim 5, further comprising interpreting a pixel associated with a first sub-array as a logically adjacent pixel to an equivalent pixel in second sub-array.

7. The method as in claim 5, further comprising reading an image by a first sub-array that is the same image read by a second sub-array with the center difference, such that data corresponding to the first sub-array and data corresponding to the second sub-array are combined to produce an image that corresponds to the number of pixels in the vertically stacked pixel array.

8. The method as in claim 1, wherein the colors of light sensed by each pixel of the vertically stacked pixel array are blue, green, and red.

9. An optical imaging system, comprising:
   a vertically stacked pixel array that is arranged as an image sensor, wherein each pixel of the vertically stacked pixel array senses multiple colors of light;
   a lenslet array that is positioned parallel to the vertically stacked pixel array between the vertically stacked pixel array and an image source according to a focal length associated with the lenslet array, such that lenses of the lenslet array focus an image onto the vertically stacked pixel array, whereby an image is read by the vertically stacked pixel array; and
   each pixel of a vertically stacked pixel array corresponds to a vertically stacked photodiode cell, wherein each vertically stacked photodiode cell includes photodiodes formed at different depths in silicon that are each sensitive to different colors of light; and
   wherein the vertically stacked pixel array is separated into sub-arrays that each correspond to an associated lens within the lenslet array.

10. The optical imaging system as in claim 9, wherein the vertically stacked pixel array includes sub-arrays that are each shifted away from each other sub-array, such that an image read by each sub-array includes a center that is different than a center of each other sub-array.

11. The optical imaging system as in claim 10, wherein a first sub-array includes a pixel that is interpreted as a logically adjacent pixel to an equivalent pixel included in second sub-array.

12. The optical imaging system an in claim 10, wherein an image read by a first sub-array is the same image read by a second sub-array with the center difference, such that data corresponding to the first sub-array and data corresponding to the second sub-array are combined to produce an image that corresponds to the number of pixels in the vertically stacked pixel array.

13. An optical imaging system for capturing an image, comprising:
   multiple means for sensing light that are arranged in an array, wherein each means for sensing light is arranged to sense multiple colors of light;
   multiple means for focusing light that are arranged in an array, wherein the means for focusing light are spaced from the means for sensing light according to an associated focal length;
   means for interpreting data associated with each means for sensing light such that an image is obtained, whereby the focal length and color distortion are minimized;

a means for associating each pixel of a vertically stacked pixel array to a corresponding vertically stacked photodiode cell, wherein each vertically stacked photodiode cell includes photodiodes formed at different depths in silicon that are each sensitive to different colors of light; and wherein the array means for sensing light is separated into sub-arrays, wherein each sub-array corresponds to a selected means for focusing light.

14. The optical imaging system as in claim 13, wherein each sub-array is shifted away from the other sub-arrays such that data associated with each sub-array is different than data associated with the other sub-arrays.

15. The optical imaging system as in claim 13, wherein data associated with each sub-array is combined to produce an image that is larger than each individual sub-array.

* * * * *